(12) United States Patent
Oh et al.

(10) Patent No.: US 12,615,041 B2
(45) Date of Patent: Apr. 28, 2026

(54) DUTY CYCLE CORRECTOR, SEMICONDUCTOR DEVICE INCLUDING THE SAME, AND OPERATING METHOD OF DUTY CYCLE CORRECTOR

(71) Applicant: SAMSUNG ELECTRONICS CO., LTD., Suwon-si (KR)

(72) Inventors: Wooseuk Oh, Suwon-si (KR); Donguk Park, Suwon-si (KR); Kihwan Seong, Suwon-si (KR); Byoungjoo Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 18/645,583

(22) Filed: Apr. 25, 2024

(65) Prior Publication Data

US 2025/0023557 A1      Jan. 16, 2025

(30) Foreign Application Priority Data

Jul. 12, 2023      (KR) ........................ 10-2023-0090488

(51) Int. Cl.
| | |
|---|---|
| *H03K 5/156* | (2006.01) |
| *H03K 3/037* | (2006.01) |
| *G11C 7/22* | (2006.01) |

(52) U.S. Cl.
CPC .......... *H03K 5/1565* (2013.01); *H03K 3/037* (2013.01); *G11C 7/222* (2013.01)

(58) Field of Classification Search
None
See application file for complete search history.

(56) References Cited

U.S. PATENT DOCUMENTS

| | | | | |
|---|---|---|---|---|
| 5,920,217 A | * | 7/1999 | Mellot | H03K 5/1565 |
| | | | | 331/74 |
| 7,495,491 B2 | * | 2/2009 | Wu | H03K 5/1565 |
| | | | | 327/175 |
| 7,999,588 B1 | | 8/2011 | Pan et al. | |
| 8,513,997 B2 | | 8/2013 | Hesen et al. | |
| 9,225,324 B2 | | 12/2015 | Arcudia et al. | |
| 10,644,680 B1 | * | 5/2020 | Paraschou | H03K 7/08 |
| 10,699,669 B2 | | 6/2020 | Amirkhany et al. | |
| 10,712,769 B2 | | 7/2020 | Zhang et al. | |
| 10,998,896 B2 | | 5/2021 | Hsieh | |
| 2013/0200934 A1 | * | 8/2013 | Hertle | H03K 5/1565 |
| | | | | 327/175 |
| 2020/0106429 A1 | * | 4/2020 | Doppalapudi | H03K 5/05 |
| 2021/0152167 A1 | * | 5/2021 | Doppalapudi | H03K 7/08 |
| 2022/0200781 A1 | * | 6/2022 | Kundu | H03L 7/087 |
| 2023/0353338 A1 | * | 11/2023 | Kushnir | H04L 7/0016 |

FOREIGN PATENT DOCUMENTS

| | | |
|---|---|---|
| CN | 113258923 | 8/2021 |
| KR | 10-2101003 | 4/2020 |

* cited by examiner

*Primary Examiner* — Cassandra F Cox
(74) *Attorney, Agent, or Firm* — Morgan, Lewis & Bockius LLP

(57) ABSTRACT

A duty cycle corrector (DCC) includes a first duty cycle correction circuit, a second duty cycle correction circuit, and overshoot prevention circuit connected between the first duty cycle correction circuit and the second duty cycle correction circuit. Each of the duty cycle correction circuits include a capacitor, two inverters, a resister, and two switches.

20 Claims, 13 Drawing Sheets

START

TURN ON FIRST SWITCH, THIRD SWITCH, FIFTH SWITCH, AND SIXTH SWITCH AND TURN OFF SECOND SWITCH AND FOURTH SWITCH — S110

TURN OFF FIRST SWITCH AND THIRD SWITCH — S120

APPLY INPUT CLOCK SIGNAL TO DCC — S130

TURN ON SECOND SWITCH AND FOURTH SWITCH AND TURN OFF FIFTH SWITCH AND SIXTH SWITCH — S140

END

START

TURN ON FIRST SWITCH AND THIRD SWITCH AND
TURN OFF SECOND SWITCH AND FOURTH SWITCH — S210

TURN ON SECOND SWITCH AND FOURTH SWITCH
AND TURN OFF FIRST SWITCH AND THIRD SWITCH — S220

APPLY INPUT CLOCK SIGNAL TO DCC — S230

END

DUTY CYCLE CORRECTOR, SEMICONDUCTOR DEVICE INCLUDING THE SAME, AND OPERATING METHOD OF DUTY CYCLE CORRECTOR

CROSS-REFERENCE TO RELATED APPLICATION

This patent application claims priority under 35 U.S.C. § 119 to Korean Patent Application No. 10-2023-0090488, filed on Jul. 12, 2023, in the Korean Intellectual Property Office, the disclosure of which is incorporated by reference in its entirety herein.

TECHNICAL FIELD

The inventive concept relates to a duty cycle corrector (DCC), and more particularly, to a DCC for preventing an overshoot or undershoot according to a change in a voltage applied to a node, a semiconductor device including the same, and a method of operating the DCC.

DISCUSSION OF RELATED ART

Semiconductor devices may transmit and receive data to each other at a high speed in synchronization with a clock signal. The clock signal is a periodic signal that oscillates between two levels such as an active level and an inactive level. A duty cycle is the ratio of the time a signal is active to the total period of the signal. An error may occur within a semiconductor device when the duty cycle of the clock signal changes to an undesirable value. A DCC may be used to adjust the duty of the clock signal. However, the DCC may become damaged when an overshoot or an undershoot occurs in a transistor of the DCC.

SUMMARY

At least one embodiment of the inventive concept provides a duty cycle corrector (DCC) for preventing an overshoot or undershoot which may occur at a node in the DCC, a semiconductor device including the same, and a method of operating the DCC.

According to an aspect of the inventive concept, there is provided a DCC including a first capacitor connected between a terminal receiving a first input clock signal and a first node, a first inverter connected between the first node and a second node, a second inverter connected between the second node and a terminal outputting a first output clock signal, a first resistor connected between the first node and the second node, a first switch connected between the first node and a terminal receiving a ground voltage, a second switch connected between the second node and the first resistor, a second capacitor connected between a terminal receiving a second input clock signal forming a differential signal pair with the first input clock signal and a third node, a third inverter connected between the third node and a fourth node, a fourth inverter connected between the fourth node and a terminal outputting a second output clock signal, a second resistor connected between the third node and the fourth node, a third switch connected between the third node and a terminal receiving a supply voltage, and a fourth switch connected between the fourth node and the second resistor, and further including an overshoot prevention circuit connected between the first node and the third node.

According to an aspect of the inventive concept, there is provided a DCC including a first duty cycle correction circuit configured to receive a first input clock signal and including a first alternating current (AC) coupling capacitor and a first inverter connected to a first feedback resistor, a second duty cycle correction circuit configured to receive a second input clock signal and including a second AC coupling capacitor and a third inverter connected to a second feedback resistor, and an overshoot prevention circuit connected between a first node connecting the first capacitor to the first inverter and a third node connecting the second capacitor to the third inverter.

According to an aspect of the inventive concept, there is provided a semiconductor device including a clock generator and a DCC including a first duty cycle correction circuit configured to receive a first input clock signal and including a first AC coupling capacitor and a first inverter connected to a first feedback resistor, a second duty cycle correction circuit configured to receive a second input clock signal and including a second AC coupling capacitor and a third inverter connected to a second resistor that is a feedback resistor, and an overshoot prevention circuit connected between a first node connecting the first capacitor to the first inverter and a third node connecting the second capacitor to the third inverter.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments are described in detail with reference to the accompanying drawings.

Figure 1:
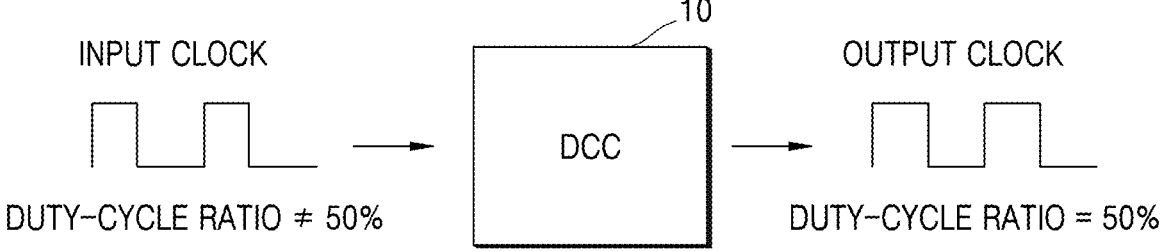
FIG. 1 is a block diagram illustrating a duty cycle corrector (DCC) according to an embodiment.

FIG. 1 is a block diagram illustrating a duty cycle corrector (DCC) 10 according to an embodiment.

Referring to FIG. 1, the DCC 10 may receive an input clock signal Input Clock as an input signal and output an output clock signal Output Clock by adjusting the duty cycle of the input clock signal Input Clock.

The DCC 10 may receive the input clock signal Input Clock having a random duty cycle and output the output clock signal Output Clock having a duty cycle of 50%. For example, the duty cycle of the input clock signal Input Clock may differ from the duty cycle of the output clock signal Output Clock. Further, the output clock signal Output Clock may be set to have a duty cycle different from 50% in other embodiments.

In an embodiment, the input clock signal Input Clock is a differential clock signal pair. Accordingly, the generated output clock signal Output Clock may also be a differential clock signal pair. For example, each of the clock signals may include a pair of complementary voltage signals to represent a single clock pulse.

Figure 2:
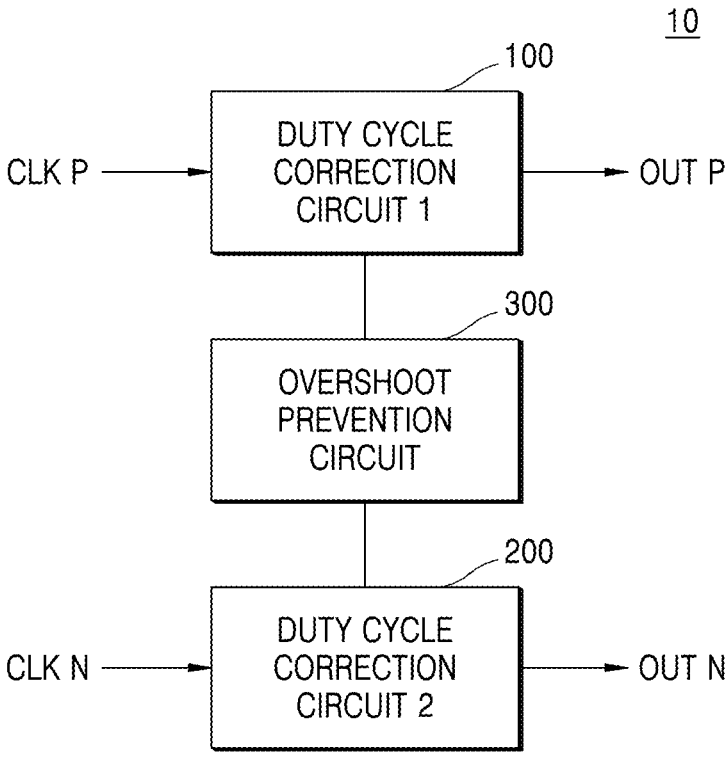
FIG. 2 is a block diagram illustrating a DCC according to an embodiment.

FIG. 2 is a block diagram illustrating the DCC 10 according to an embodiment.

Referring to FIG. 2, the DCC 10 may include a first duty cycle correction circuit 100, a second duty cycle correction circuit 200, and an overshoot prevention circuit 300.

The first duty cycle correction circuit 100 may receive a first input clock signal CLK P as an input signal and output a first output clock signal OUT P by adjusting the duty cycle of the first input clock signal CLK P.

The second duty cycle correction circuit 200 may receive a second input clock signal CLK N as an input signal and output a second output clock signal OUT N by adjusting the duty cycle of the second input clock signal CLK N.

In an embodiment, the first input clock signal CLK P and the second input clock signal CLK N are a differential clock signal pair and may have phases complementary to each other, and the first output clock signal OUT P and the second output clock signal OUT N are also a differential clock signal pair and may have phases complementary to each other.

The overshoot prevention circuit 300 may be connected between the first duty cycle correction circuit 100 and the second duty cycle correction circuit 200. The overshoot prevention circuit 300 may prevent an overshoot or undershoot according to a voltage change which may occur in the DCC 10.

That is, the overshoot prevention circuit 300 may prevent an overvoltage between nodes included in the DCC 10, thereby preventing damage to a transistor included in the DCC 10 due to the overvoltage.

The overshoot prevention circuit 300 may also be referred to as an undershoot prevention circuit.

A method, performed by the overshoot prevention circuit 300, of preventing an overvoltage between nodes included in the DCC 10 is described below in detail with reference to other drawings.

Figure 3:
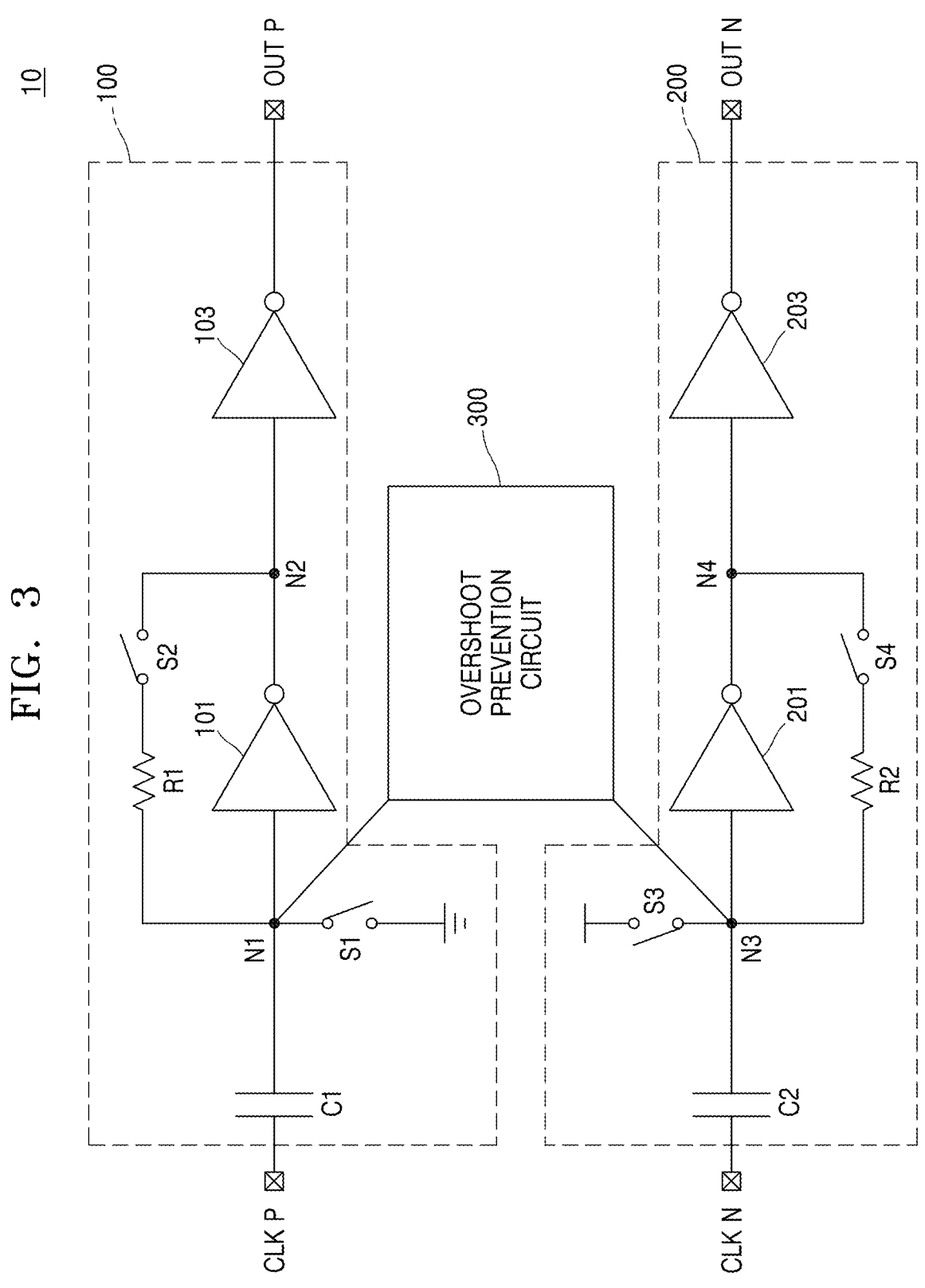
FIG. 3 is a circuit diagram illustrating an equivalent circuit of a DCC according to an embodiment.

FIG. 3 is a circuit diagram illustrating an equivalent circuit of the DCC 10 according to an embodiment.

Referring to FIG. 3, the DCC 10 may include the first duty cycle correction circuit 100, the second duty cycle correction circuit 200, and the overshoot prevention circuit 300.

In an embodiment, the first duty cycle correction circuit 100 includes a first capacitor C1, a first inverter 101, a second inverter 103, a first resistor R1, a first switch S1, and a second switch S2. In an embodiment, the first capacitor C1 is an alternating current (AC) coupling capacitor and may remove a direct current (DC) component of the first input clock signal CLK P. In addition, the first resistor R1 is a feedback resistor of the first inverter 101, and the first duty cycle correction circuit 100 may compensate the duty cycle of the first input clock signal CLK P to a desired duty cycle (e.g., 50%) by using a feedback resistor-inverter structure.

The first capacitor C1 may be connected between a terminal to which the first input clock signal CLK P is applied and a first node N1. The first inverter 101 may be connected between the first node N1 and a second node N2. The second inverter 103 may be connected between the second node N2 and a terminal from which the first output clock signal OUT P is output. The first resistor R1 may be connected between the first node N1 and the second node N2. The first switch S1 may be connected between the first node N1 and a terminal to which a ground voltage is applied. The second switch S2 may be connected between the second node N2 and the first resistor R1. In an embodiment, the switches S1 and S2 are implemented by transistors.

In an embodiment, the second duty cycle correction circuit 200 includes a second capacitor C2, a third inverter 201, a fourth inverter 203, a second resistor R2, a third switch S3, and a fourth switch S4. In an embodiment, the second capacitor C2 is an AC coupling capacitor and may remove a DC component of the second input clock signal CLK N. In addition, the second resistor R2 is a feedback resistor of the third inverter 201, and the second duty cycle correction circuit 200 may compensate the duty cycle of the second input clock signal CLK N to a desired duty cycle (e.g., 50%) by using a feedback resistor-inverter structure. In an embodiment, the switches S3 and S4 are implemented by transistors.

The second capacitor C2 may be connected between a terminal to which the second input clock signal CLK N forming a differential signal pair with the first input clock signal CLK P is applied and a third node N3. The third inverter 201 may be connected between the third node N3 and a fourth node N4. The fourth inverter 203 may be connected between the fourth node N4 and a terminal from which the second output clock signal OUT N is output. The second resistor R2 may be connected between the third node N3 and the fourth node N4. The third switch S3 may be connected between the third node N3 and a terminal to which a supply voltage is applied. The fourth switch S4 may be connected between the fourth node N4 and the second resistor R2. In an embodiment, the supply voltage is a positive voltage or differs from a ground voltage. In an embodiment, the first switch S1 receives a voltage different from the ground voltage and the supply voltage received by the third switch S3 such as a negative supply voltage.

The overshoot prevention circuit 300 may be connected between the first node N1 and the third node N3. In an embodiment, the overshoot prevention circuit 300 prevents an overshoot (or an undershoot) according to a change in a voltage applied to each of the first node N1 and the third node N3.

Figure 4:
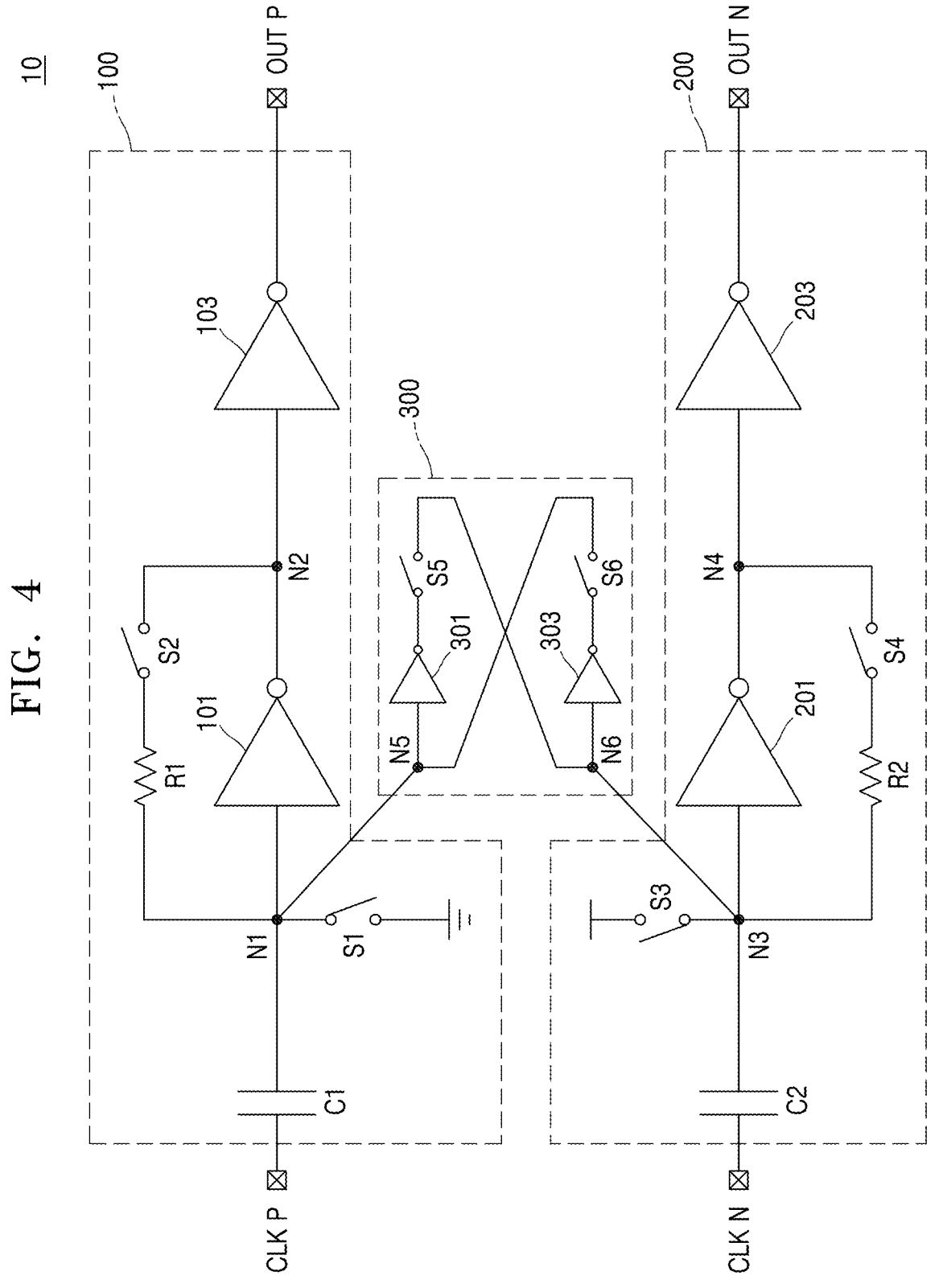
FIG. 4 is a circuit diagram illustrating an equivalent circuit of a DCC according to an embodiment.
Figure 5:
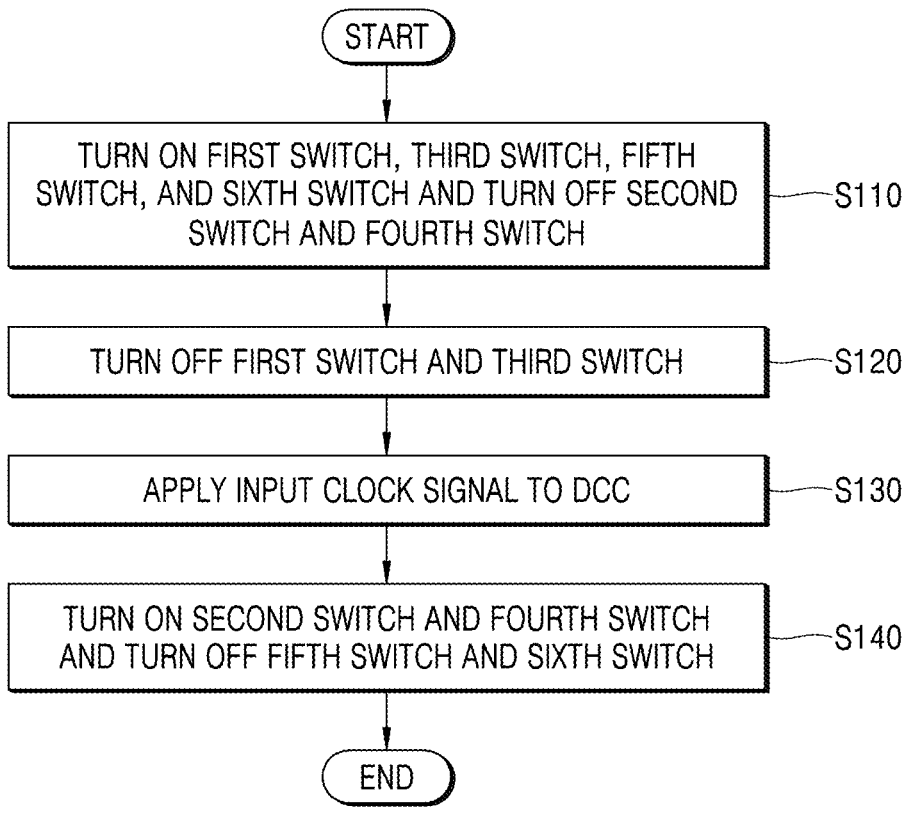
FIG. 5 is a flowchart illustrating an operating method of a DCC, according to an embodiment.

FIG. 4 is a circuit diagram illustrating an equivalent circuit of the DCC 10 according to an embodiment. FIG. 5 is a flowchart illustrating a method of operating the DCC 100, according to an embodiment.

Referring to FIG. 4, in an embodiment, the overshoot prevention circuit 300 includes a cross-coupled latch.

In an embodiment, the overshoot prevention circuit 300 includes a fifth inverter 301, a sixth inverter 303, a fifth switch S5, and a sixth switch S6.

The fifth inverter 301 may be connected between a fifth node N5 connected to the first node N1 described with reference to FIG. 3 and a sixth node N6 connected to the third node N3 described with reference to FIG. 3. In addition, the sixth inverter 303 may be connected between the sixth node N6 and the fifth node N5. Herein, the fifth inverter 301 and the sixth inverter 303 may be connected in a cross-coupled form between the fifth node N5 and the sixth node N6.

The fifth switch S5 may be connected between the fifth inverter 301 and the sixth node N6. In addition, the sixth switch S6 may be connected between the sixth inverter 303 and the fifth node N5. In an embodiment, the fifth and sixth switches S5 and S6 are implemented by transistors.

In an embodiment, the DCC 10 operates while turning on or off the first to sixth switches S1, S2, S3, S4, S5, and S6 in response to a control signal of a control circuit. For example, the control circuit may provide one or more control signals to gates of transistors being used to implement the first to sixth switches S1, S2, S3, S4, S5, and S6.

In another embodiment, the DCC 10 may operate while turning on or off the first to sixth switches S1, S2, S3, S4, S5, and S6 in response to a supply voltage applied to each of the first to sixth switches S1, S2, S3, S4, S5, and S6.

Referring to FIG. 5, in operation S110, the DCC 10 turns on the first switch S1, turns on the third switch S3, turns on the fifth switch S5, turns on the sixth switch S6, turns off the second switch S2 and turns off the fourth switch S4.

Operation S110 is an initial state before an input clock signal, i.e., the first and second input clock signals CLK P and CLK N, is applied to the DCC 10. Herein, by turning on the first switch S1 and the third switch S3, the voltage level of the first node N1 may be the same as the level of the ground voltage VSS, and the voltage level of the third node N3 may be the same as the level of the positive supply voltage VDD.

In addition, in operation S110, by turning on the fifth switch S5 and the sixth switch S6, the cross-coupled latch (the overshoot prevention circuit 300) between the first node N1 and the third node N3 may be activated. That is, the level of the ground voltage VSS may be latched to the fifth node N5 connected to the first node N1, and the level of the positive supply voltage VDD may be latched to the sixth node N6 connected to the third node N3.

In operation S120, the DCC 10 turns off the first switch S1 and turns off the third switch S3. For example, the fifth switch S5 and the sixth switch S6 remain turned on.

In operation S120, even though the first switch S1 and the third switch S3 are turned off, the voltage level of the first node N1 may be the level of the ground voltage VSS due to the cross-coupled latch (the overshoot prevention circuit 300), and the voltage level of the third node N3 may be the level of the positive supply voltage VDD due to the cross-coupled latch (the overshoot prevention circuit 300).

In operation S130, the DCC 10 receives the input clock signal, i.e., the first and second input clock signals CLK P and CLK N, as an input value. The first duty cycle correction circuit 100 may receive the first input clock signal CLK P as an input value, and the second duty cycle correction circuit 200 may receive the second input clock signal CLK N forming a differential signal pair with the first input clock signal CLK P as an input value.

Herein, in the first input clock signal CLK P, a rising edge where the ground voltage VSS changes to the positive supply voltage VDD may occur first, and on the contrary, in the second input clock signal CLK N, a falling edge where the positive supply voltage VDD changes to the ground voltage VSS may occur first. However, the present embodiment is not limited thereto. For example, in the first input clock signal CLK P, a falling edge where the positive supply voltage VDD changes to the ground voltage VSS may occur first, and on the contrary, in the second input clock signal CLK N, a rising edge where the ground voltage VSS changes to the positive supply voltage VDD may occur first.

In addition, in operation S130, the voltage level of the first node N1 should not exceed a voltage range allowed by the cross-coupled latch (the overshoot prevention circuit 300). For example, the voltage level of the first node N1 should have a level between the level of the ground voltage VSS and the level of the positive supply voltage VDD due to the cross-coupled latch (the overshoot prevention circuit 300).

Likewise, in operation S130, the voltage level of the third node N3 should not exceed a voltage range allowed by the cross-coupled latch (the overshoot prevention circuit 300). For example, the voltage level of the third node N3 should have a level between the level of the ground voltage VSS and the level of the positive supply voltage VDD due to the cross-coupled latch (the overshoot prevention circuit 300).

In operation S140, the DCC 10 turns on the second switch S2, turns on the fourth switch S4, turns off the fifth switch S5 and turns off the sixth switch S6.

In operation S140, by turning off the fifth switch S5 and turning off the sixth switch S6, the cross-coupled latch (the overshoot prevention circuit 300) may become inactivated or deactivated. That is, in operation S140, the DCC 10 may disconnect the cross-coupled latch (the overshoot prevention circuit 300).

In addition, in operation S140, by turning on the second switch S2 and turning on the fourth switch S4, the duty cycle of the input clock signal, i.e., the first and second input clock signals CLK P and CLK N, may be compensated for by a feedback resistor, i.e., the first and second resistors R1 and R2.

That is, in operation S140, the DCC 10 may adjust the duty cycle of the input clock signal, i.e., the first and second input clock signals CLK P and CLK N, based on the feedback resistor, i.e., the first and second resistors R1 and R2, and output an output clock signal, i.e., the first and second output clock signals OUT P and OUT N, having the adjusted duty cycle.

When the cross-coupled latch (the overshoot prevention circuit 300) is disconnected, the voltage level of the first node N1 may exceed the voltage range allowed by the cross-coupled latch (the overshoot prevention circuit 300) in operation S130.

Likewise, when the cross-coupled latch (the overshoot prevention circuit 300) is disconnected, the voltage level of the third node N3 may exceed the voltage range allowed by the cross-coupled latch (the overshoot prevention circuit 300) in operation S130.

Figure 6:
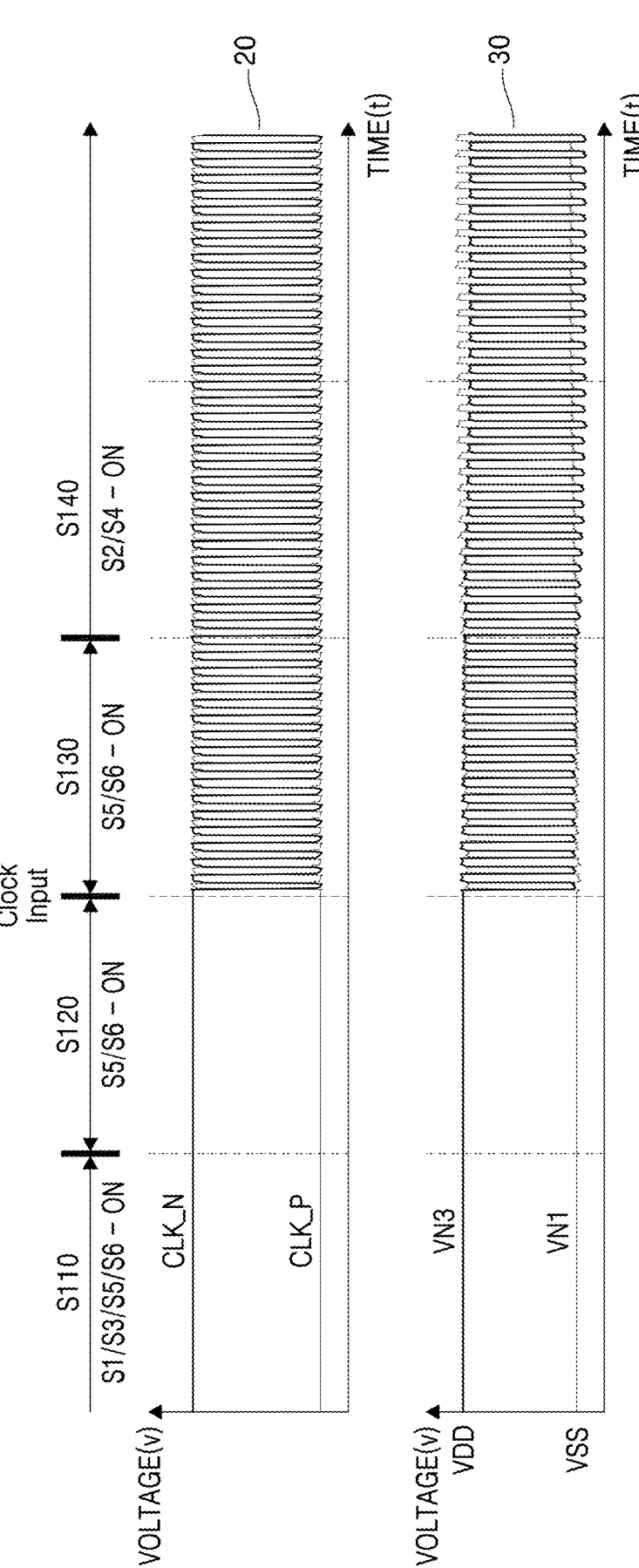
FIG. 6 is a graph showing a voltage level of an input clock signal, a voltage level of a first node, and a voltage level of a third node over time in a method of operating a DCC, according to an embodiment.

FIG. 6 is a graph showing the voltage level of an input clock signal, i.e., the first and second input clock signals CLK_P and CLK_N, a voltage level VN1 of a first node N1, and a voltage level VN3 of a third node N3 over time in a method of operating a DCC, according to an embodiment.

FIG. 6 includes a graph 20 showing the voltage levels of the first and second input clock signals CLK_P and CLK_N and a graph 30 showing the voltage level VN1 of the first node N1 and the voltage level VN3 of the third node N3, over time in correspondence to each operation of the flowchart described with reference to FIG. 5.

Referring to FIG. 6, in operation S110, by turning on only the first switch S1, the third switch S3, the fifth switch S5, and the sixth switch S6, the voltage level VN1 of the first node N1 may be the same as the level of the ground voltage VSS, and the voltage level VN3 of the third node N3 may be the same as the level of the positive supply voltage VDD.

Referring to FIG. 6, in operation S120, by turning on only the fifth switch S5 and the sixth switch S6, even though the first switch S1 and the third switch S3 are turned off, the voltage level VN1 of the first node N1 may maintain the level of the ground voltage VSS due to the cross-coupled latch (the overshoot prevention circuit 300), and the voltage level VN3 of the third node N3 may maintain the level of the positive supply voltage VDD due to the cross-coupled latch (the overshoot prevention circuit 300).

Referring to FIG. 6, in operation S130, by turning on only the fifth switch S5 and the sixth switch S6 and applying the first and second input clock signals CLK_P and CLK_N to the DCC 10, the voltage level VN1 of the first node N1 and the voltage level VN3 of the third node N3 may have only a level between the level of the ground voltage VSS and the level of the positive supply voltage VDD due to the cross-coupled latch (the overshoot prevention circuit 300).

Referring to FIG. 6, in operation S140, by turning on only the second switch S2 and the fourth switch S4 and disconnecting the cross-coupled latch (the overshoot prevention circuit 300), the voltage level VN1 of the first node N1 and the voltage level VN3 of the third node N3 may exceed the voltage range allowed by the cross-coupled latch (the overshoot prevention circuit 300) in operation S130.

According to an embodiment of the inventive concept, by connecting the overshoot prevention circuit 300 (or an undershoot prevention circuit) between the first duty cycle correction circuit 100 and the second duty cycle correction circuit 200, an overshoot (or an undershoot) according to a change in a voltage may be prevented.

Figure 7:
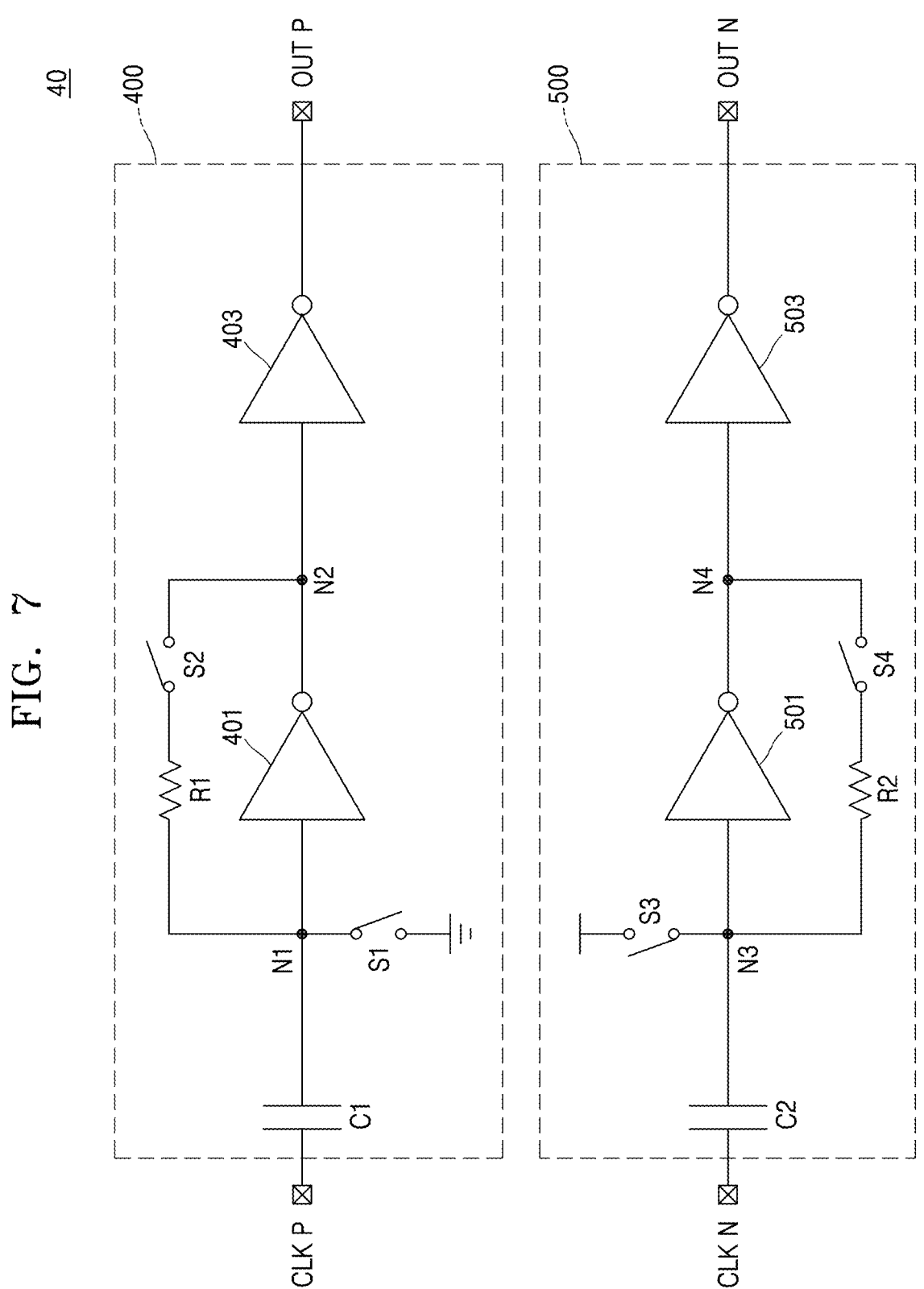
FIG. 7 is a circuit diagram illustrating an equivalent circuit of a DCC according to a comparative example.
Figure 8:
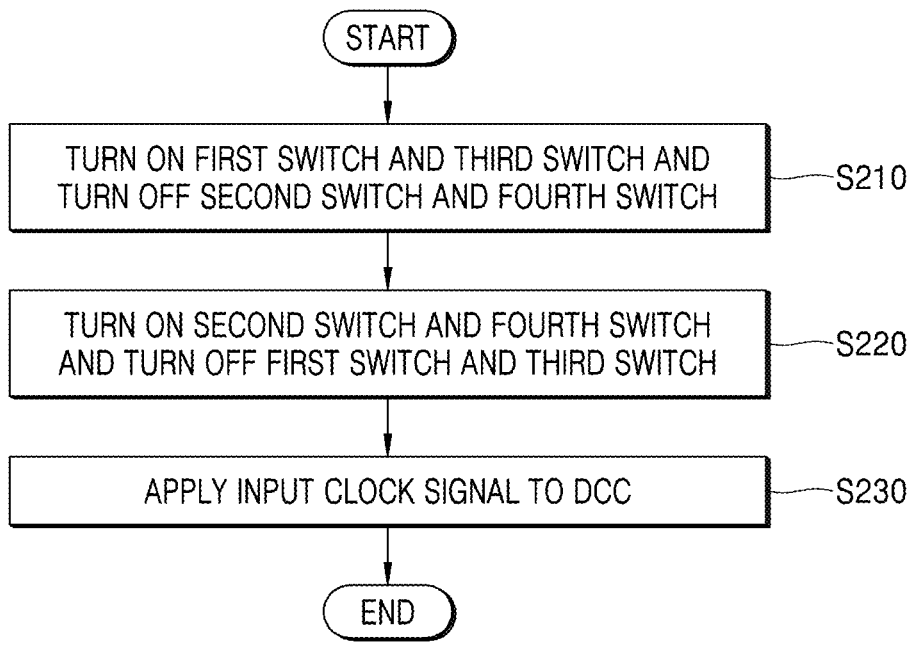
FIG. 8 is a flowchart illustrating a first operating method of a DCC, according to a comparative example.
Figure 9:
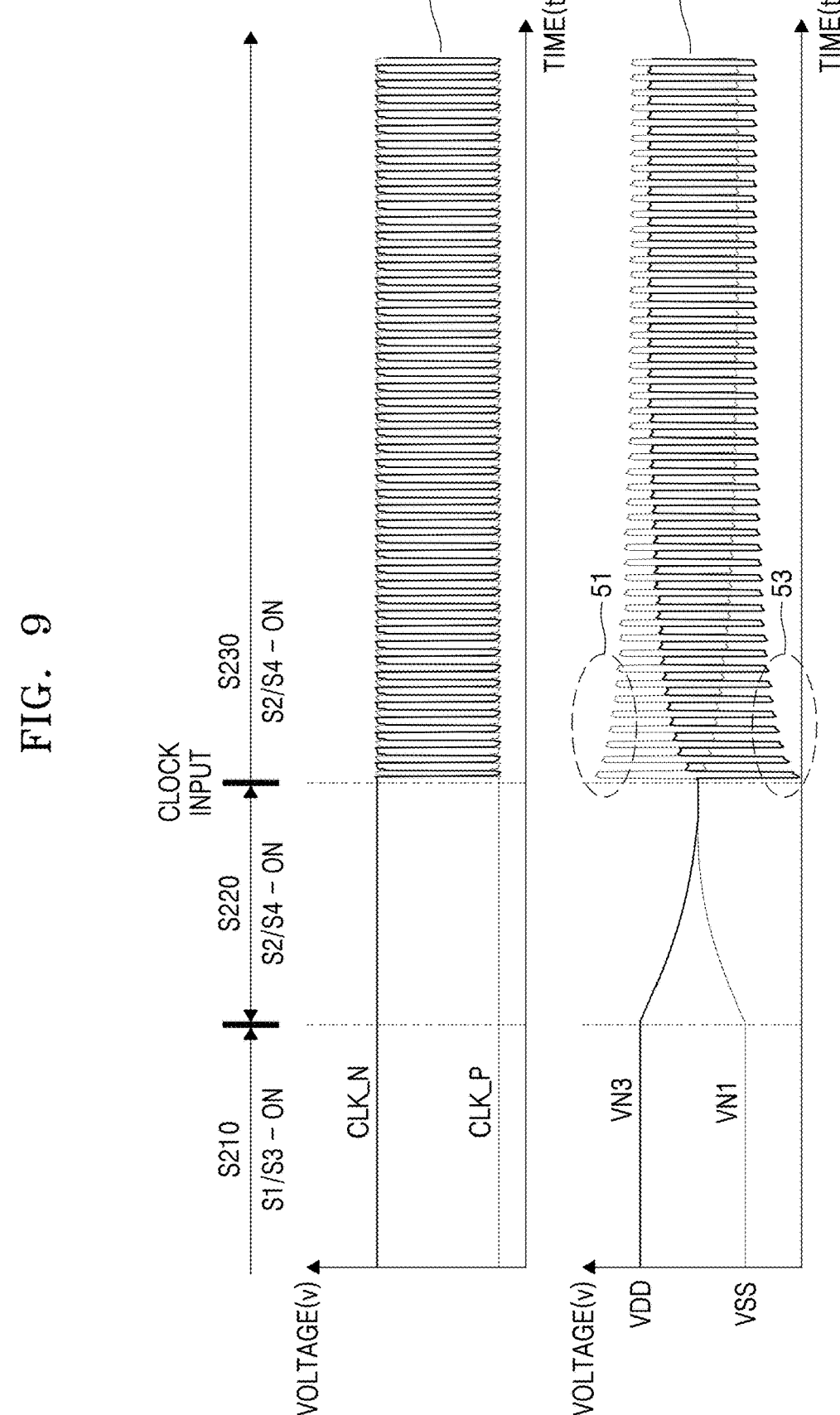
FIG. 9 is a graph showing a voltage level of the input clock signal, the voltage level of a first node, and the voltage level of a third node over time in a first operating method of a DCC, according to a comparative example.
Figure 10:
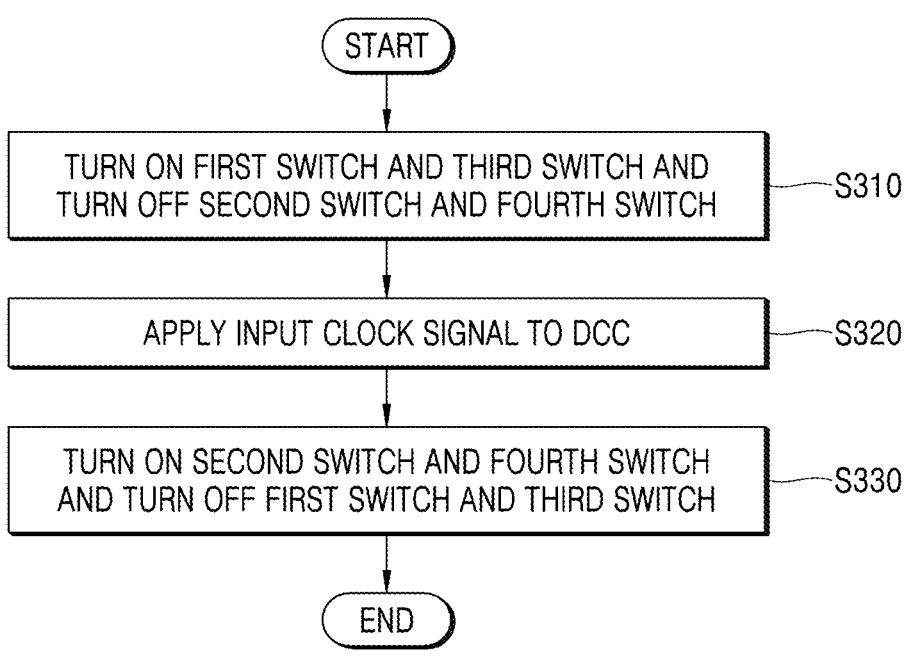
FIG. 10 is a flowchart illustrating a second operating method of a DCC, according to a comparative example.
Figure 11:
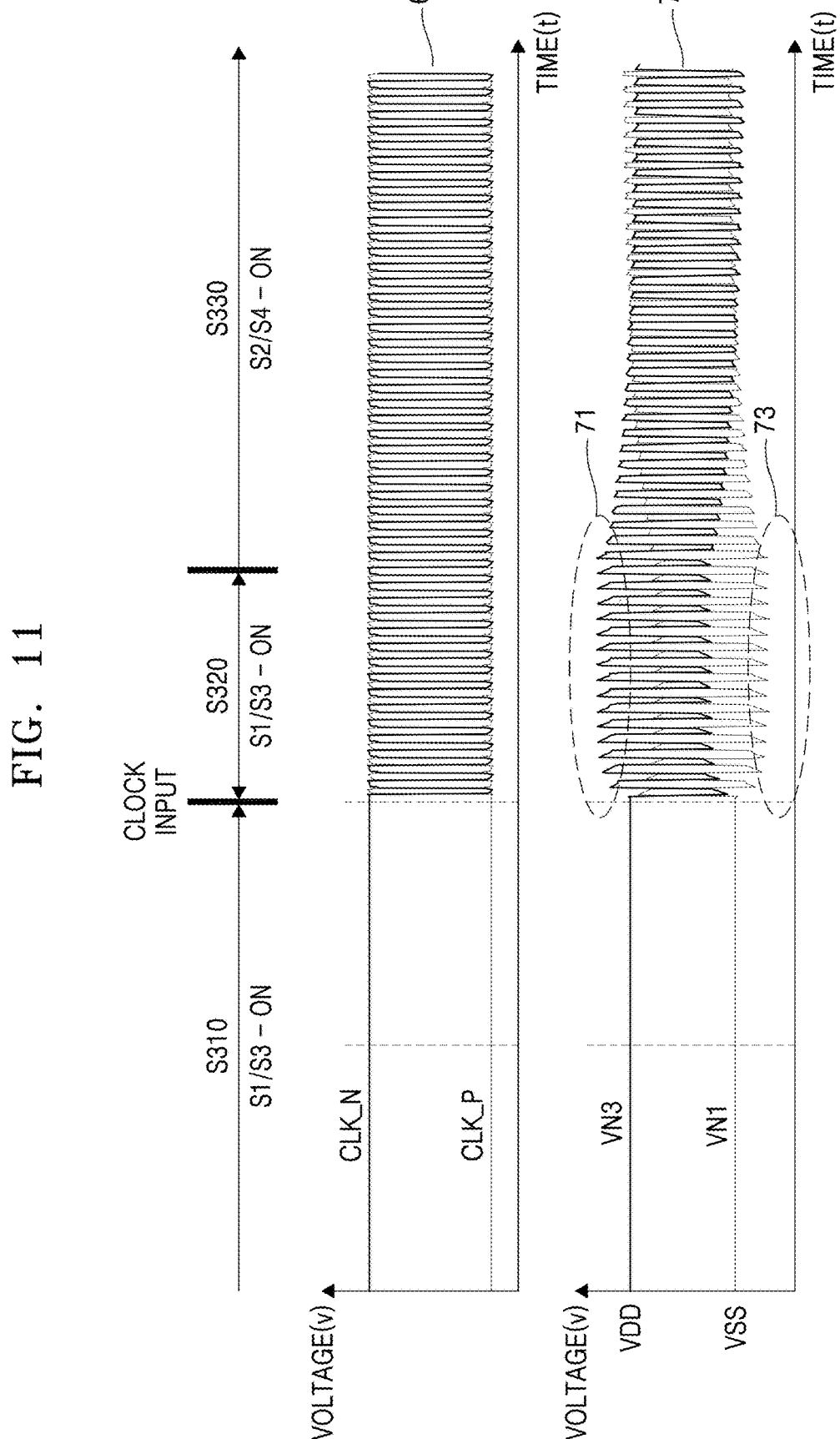
FIG. 11 is a graph showing a voltage level of the input clock signal, a voltage level of a first node, and a voltage level of a third node over time in a second operating method of a DCC, according to a comparative example.

FIG. 7 is a circuit diagram illustrating an equivalent circuit of a DCC 40 according to a comparative example. FIG. 8 is a flowchart illustrating a first operating method of a DCC, according to a comparative example. FIG. 9 is a graph showing the voltage level of an input clock signal, i.e., the first and second input clock signals CLK_P and CLK_N, the voltage level VN1 of the first node N1, and the voltage level VN3 of the third node N3 over time in the first operating method of a DCC, according to a comparative example. FIG. 10 is a flowchart illustrating a second operating method of a DCC, according to a comparative example. FIG. 11 is a graph showing the voltage level of an input clock signal, i.e., the first and second input clock signals CLK_P and CLK_N, the voltage level VN1 of the first node N1, and the voltage level VN3 of the third node N3 over time in the second operating method of a DCC, according to a comparative example.

Referring to FIG. 7, the DCC 40 according to a comparative example includes only a first duty cycle correction circuit 400 and a second duty cycle correction circuit 500. That is, while the DCC 10 according to the inventive concept described with reference to FIGS. 1 to 6 includes the overshoot prevention circuit 300, the DCC 40 according to a comparative example does not include a feature corresponding to the overshoot prevention circuit 300.

In FIG. 7, a description made with reference to FIGS. 3 and 4 is omitted to avoid repetitive description.

The DCC 40 according to a comparative example may have two operating methods according to an order of an operation of applying the first and second input clock signals CLK_P and CLK_N to the DCC 40 and an operation of turning on the second switch S2 and the fourth switch S4 and turning off the first switch S1 and the third switch S3.

First, the first operating method, performed by the DCC 40 according to a comparative example, of performing the operation of turning on the second switch S2 and the fourth switch S4 and turning off the first switch S1 and the third switch S3 and then performing the operation of applying the first and second input clock signals CLK_P and CLK_N to the DCC 40 is described with reference to FIGS. 8 and 9.

Referring to FIG. 8, in operation S210, the DCC 40 turns on the first switch S1, turns on the third switch S3, turns off the second switch S2 and turns off the fourth switch S4.

Operation S210 is an initial state before an input clock signal, i.e., the first and second input clock signals CLK P and CLK N, is applied to the DCC 40. Herein, referring to FIG. 9, by turning on the first switch S1 and the third switch S3, the voltage level VN1 of the first node N1 may be the same as the level of the ground voltage VSS, and the voltage level VN3 of the third node N3 may be the same as the level of the positive supply voltage VDD.

In operation S220, the DCC 40 turns on the second switch S2, turns on the fourth switch S4, turns off the first switch S1 and turns off the third switch S3. Herein, referring to FIG. 9, the voltage level VN1 of the first node N1 may change from the level of the ground voltage VSS to $$\frac{VSS + VDD}{2}.$$

In addition, the voltage level VN3 of the third node N3 may change from the level of the positive supply voltage VDD to $$\frac{VSS + VDD}{2}.$$

In operation S230, the DCC 40 may receive the input clock signal, i.e., the first and second input clock signals CLK P and CLK N, as an input value. The first duty cycle correction circuit 400 may receive the first input clock signal CLK P as an input value, and the second duty cycle correction circuit 500 may receive the second input clock signal CLK N forming a differential signal pair with the first input clock signal CLK P as an input value.

Herein, referring to FIG. 9, an overshoot 51 may occur in the voltage level VN1 of the first node N1 due to the applied first input clock signal CLK P. In addition, an undershoot 53 may occur in the voltage level VN3 of the third node N3 due to the applied second input clock signal CLK N.

Next, the second operating method, performed by the DCC 40 according to a comparative example, of performing the operation of applying the first and second input clock signals CLK_P and CLK_N thereto and then performing the operation of turning on the second switch S2 and the fourth switch S4 and turning off the first switch S1 and the third switch S3 is described with reference to FIGS. 10 and 11.

Referring to FIG. 10, in operation S310, the DCC 40 turns on the first switch S1, turns on the third switch S3, turns off the second switch S2 and turns off the fourth switch S4.

Operation S310 is an initial state before an input clock signal, i.e., the first and second input clock signals CLK P and CLK N, is applied to the DCC 40. Herein, referring to FIG. 11, by turning on the first switch S1 and the third switch S3, the voltage level VN1 of the first node N1 may be the same as the level of the ground voltage VSS, and the voltage level VN3 of the third node N3 may be the same as the level of the positive supply voltage VDD.

In operation S320, the DCC 40 may receive the input clock signal, i.e., the first and second input clock signals CLK P and CLK N, as an input value. The first duty cycle correction circuit 400 may receive the first input clock signal CLK P as an input value, and the second duty cycle correction circuit 500 may receive the second input clock signal CLK N forming a differential signal pair with the first input clock signal CLK P as an input value.

Herein, referring to FIG. 11, an overshoot 71 may occur in the voltage level VN1 of the first node N1 due to the applied first input clock signal CLK P. In addition, an undershoot 73 may occur in the voltage level VN3 of the third node N3 due to the applied second input clock signal CLK N.

In operation S330, the DCC 40 turns on the second switch S2, turns on the fourth switch S4, turns off the first switch S1 and turns off the third switch S3. Herein, referring to FIG. 11, the aftereffect of the overshoot 71 and the undershoot 73 having occurred in operation S320 remains in the voltage level VN1 of the first node N1 and the voltage level VN3 of the third node N3, respectively.

Referring to FIGS. 6, 9, and 11, according to an embodiment of the inventive concept compared with the comparative examples, by connecting the overshoot prevention circuit 300 (or an undershoot prevention circuit) between the first duty cycle correction circuit 100 and the second duty cycle correction circuit 200, an overshoot (or an undershoot) according to a change in a voltage may be prevented.

In addition, according to an embodiment of the inventive concept, the overshoot prevention circuit 300 may prevent an overvoltage between nodes included in the DCC 10 without additional power consumption or performance degradation.

According to an embodiment of the inventive concept, the overshoot prevention circuit 300 may prevent an overshoot (or an undershoot) according to a change in a voltage applied to a node (e.g., the first node N1 and the third node N3) connecting an AC coupling capacitor to a feedback resistor-inverter structure.

In addition, according to an embodiment of the inventive concept, the overshoot prevention circuit 300 may prevent damage to a transistor included in the DCC 10 due to an overvoltage.

Figure 12:
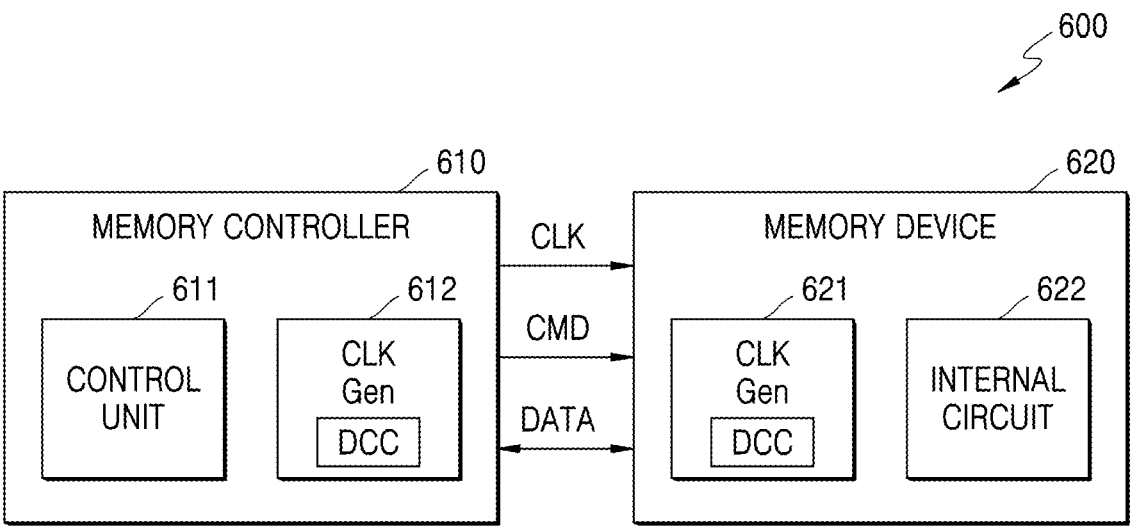
FIG. 12 is a block diagram illustrating a memory system including a DCC according to an embodiment.

FIG. 12 is a block diagram illustrating a memory system 600 including a DCC according to an embodiments.

As shown in FIG. 12, the memory system 600 may include various types of memory devices, for example, a volatile memory including dynamic random access memory (DRAM) or the like or a nonvolatile memory including a flash memory device, a resistive memory device, or the like, as described above. The memory system 600 may include a memory controller 610 and a memory device 620. A clock signal CLK, a command CMD, data DATA, and the like may be transmitted and received between the memory controller 610 and the memory device 620.

The memory controller 610 may include a control unit 611 configured to generate various kinds of control signals to control a memory operation and also include a clock generator 612 configured to generate the clock signal CLK to be provided to the memory device 620. The clock generator 612 may include a DCC according to embodiments so that the duty of the clock signal CLK is symmetrical. For example, the clock generator 612 may include the DCC 10 of FIG. 3.

In addition, the clock generator 612 may generate an input clock signal (e.g., the first and second input clock signals CLK P and CLK N shown in FIGS. 3, 4, and 7) that is a differential signal pair and provide the input clock signal (e.g., the first and second input clock signals CLK P and CLK N shown in FIGS. 3, 4, and 7) that is a differential signal pair to the DCC.

Similarly, the memory device 620 may include a clock generator 621 configured to generate an internal clock signal by using the clock signal CLK. According to an embodiment described above, a clock generator, such as a phase-locked loop or a delay-locked loop, may be applied to the clock generator 621. In addition, the clock generator 621 may include a DCC according to embodiments. For example, the clock generator 622 may include the DCC 10 of FIG. 3. An internal clock signal generated by the clock generator 621 may be provided to an internal circuit 622 and used in various kinds of memory operations.

Although FIG. 12 shows that a DCC according to embodiments is included in the clock generators 612 and 621, the DCC may be located outside the clock generators 612 and 621.

Figure 13:
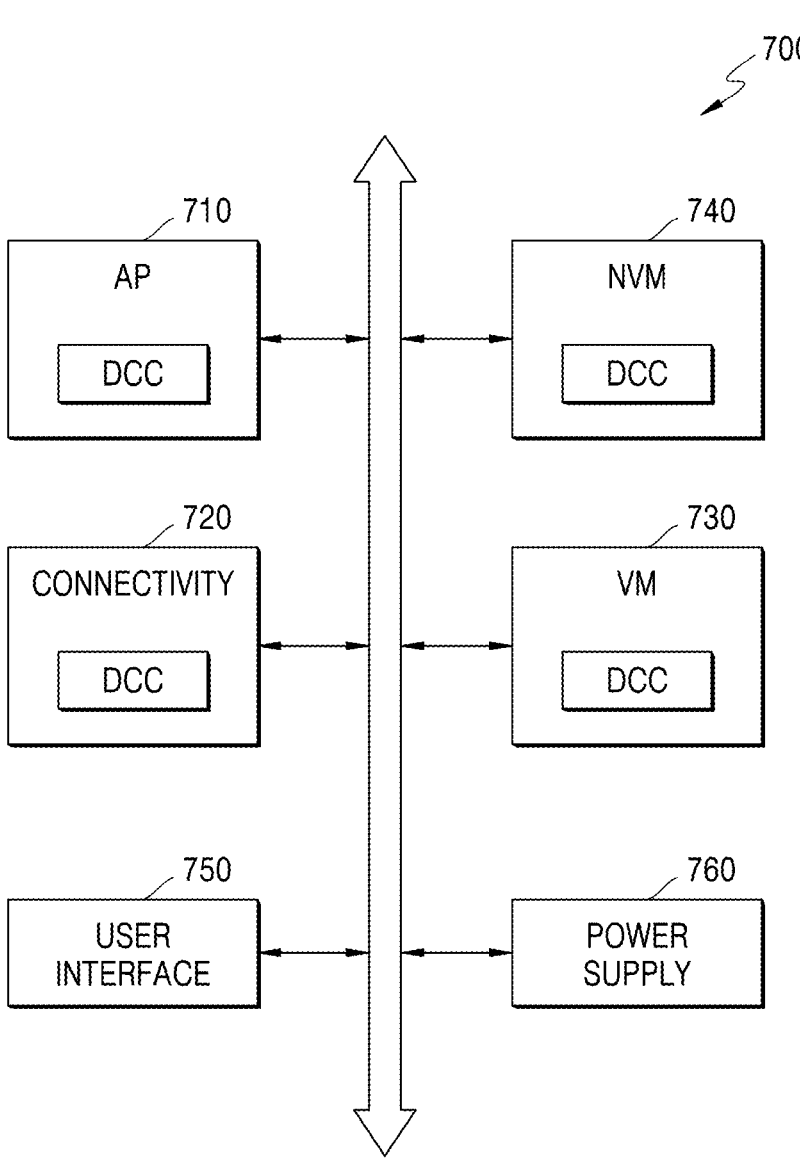
FIG. 13 is a block diagram illustrating a computing system to which a DCC according to an embodiment is applied.

FIG. 13 is a block diagram illustrating a computing system 700 to which a DCC according to an embodiment is applied. For example, the computing system 700 may correspond to a mobile device.

Referring to FIG. 13, the computing system 700 may include an application processor (AP) 710, a connectivity 720, a volatile memory device 730, a nonvolatile memory device 740, a user interface 750, and a power supply 760. According to an embodiment, the computing system 700 may be an arbitrary mobile device, such as a mobile phone, a smartphone, a personal digital assistant (PDA), a portable multimedia player (PMP), a digital camera, a music player, a portable game console, or a navigation system.

The AP 710 may control a general operation of the computing system 700 and include one processor core (a single-core processor) or a plurality of processor cores (a multi-core processor). For example, the AP 710 may include a multi-core processor, such as a dual-core processor, a quad-core processor, or a hexa-core processor.

The connectivity 720 may perform wireless or wired communication with an external device. For example, the connectivity 720 may perform Ethernet communication, near field communication (NFC), radio frequency identification (RFID) communication, mobile telecommunication, memory card communication, universal serial bus (USB) communication, or the like. For example, the connectivity 720 may include a baseband chipset and support communication, such as global system for mobile communication (GSM), wideband code division multiple access (WCDMA), or evolved high speed packet access (HSxPA).

The volatile memory device 730 may store data processed by the AP 710 or operate as a working memory. For example, the volatile memory device 730 may be implemented by DRAM, static random access memory (SRAM), mobile DRAM, double data rate synchronous dynamic random access memory (DDR SDRAM), low power double data rate synchronous dynamic random access memory (LPDDR SDRAM), graphics double data rate synchronous dynamic random access memory (GDDR SDRAM), or a similar memory.

The nonvolatile memory device 740 may store a boot image for booting the computing system 700. For example, the nonvolatile memory device 740 may be implemented by electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a similar memory.

The AP 710, the connectivity 720, the volatile memory device 730, the nonvolatile memory device 740, and the like may include a DCC according to embodiments. For example, the AP 710, the connectivity 720, the volatile memory device 730, the nonvolatile memory device 740, and the like may operate in synchronization with a certain clock signal and include a DCC according to embodiments to correct the duty of a received clock signal. For example, the AP 710, connectivity 720, the volatile memory device 730, or the nonvolatile memory device 740 may include the DCC 10 of FIG. 3.

The user interface 750 may include one or more input devices, such as a keypad and a touchscreen, and/or one or more output devices, such as a speaker and a display device. The power supply 760 may supply an operating voltage of the computing system 700. In addition, according to an embodiment, the computing system 700 may further include a camera image processor (CIP) and further include a storage device, such as a memory card, a solid state drive (SSD), a hard disk drive (HDD), or compact disc read-only memory (CD-ROM).

While the inventive concept has been particularly shown and described with reference to embodiments thereof, it will be understood that various changes in form and details may be made therein without departing from the spirit and scope of the following claims.

What is claimed is:

1. A duty cycle corrector (DCC) comprising:
a first capacitor connected between a terminal receiving a first input clock signal and a first node;
a first inverter connected between the first node and a second node;
a second inverter connected between the second node and a terminal outputting a first output clock signal;
a first resistor connected between the first node and the second node;
a first switch connected between the first node and a terminal receiving a ground voltage;
a second switch connected between the second node and the first resistor;
a second capacitor connected between a terminal receiving a second input clock signal and a third node, where the first input clock signal and the second input clock signal form a differential signal pair;
a third inverter connected between the third node and a fourth node;
a fourth inverter connected between the fourth node and a terminal outputting a second output clock signal;
a second resistor connected between the third node and the fourth node;
a third switch connected between the third node and a terminal receiving a supply voltage;
a fourth switch connected between the fourth node and the second resistor; and
an overshoot prevention circuit connected between the first node and the third node.

2. The DCC of claim 1, wherein the overshoot prevention circuit comprises:
a fifth inverter connected between a fifth node connected to the first node and a sixth node connected to the third node;
a sixth inverter connected between the sixth node and the fifth node;
a fifth switch connected between the fifth inverter and the sixth node; and
a sixth switch connected between the sixth inverter and the fifth node.

3. The DCC of claim 2, wherein a voltage level of the first node is a level of the ground voltage and a voltage level of the third node is a level of the supply voltage when the first switch, the third switch, and the fifth switch are turned on, and when the second switch and the fourth switch are turned off.

4. The DCC of claim 2, wherein a voltage level of the first node is a level of the ground voltage and a voltage level of the third node is a level of the supply voltage when the fifth switch and the sixth switch are turned on, and when the first switch, the third switch, the second switch, and the fourth switch are turned off.

5. The DCC of claim 2, wherein a voltage level of the first node and a voltage level of the third node is between a level of the ground voltage and a level of the supply voltage when the fifth switch and the sixth switch are turned on, and when the first switch, the third switch, the second switch, and the fourth switch are turned off, while the first input clock signal and the second input clock signal are received.

6. The DCC of claim 2, wherein the overshoot prevention circuit is disconnected when the second switch and the fourth switch are turned on, and when the first switch, the third switch, the fifth switch, and the sixth switch are turned off.

7. The DCC of claim 2, wherein duty cycles of the first input clock signal and the second input clock signal are compensated for based on the first resistor and the second resistor when the second switch and the fourth switch are turned on, and when the first switch, the third switch, the fifth switch, and the sixth switch are turned off.

8. A duty cycle corrector (DCC) comprising:
a first duty cycle correction circuit configured to receive a first input clock signal and comprising a first alternating current (AC) coupling capacitor and a first inverter connected to a first feedback resistor;
a second duty cycle correction circuit configured to receive a second input clock signal and comprising a second AC coupling capacitor and a third inverter connected to a second feedback resistor; and
an overshoot prevention circuit connected between a first node connecting the first AC coupling capacitor to the first inverter and a third node connecting the second AC coupling capacitor to the third inverter.

9. The DCC of claim 8, wherein the overshoot prevention circuit comprises a cross-coupled latch.

10. The DCC of claim 8, wherein the overshoot prevention circuit comprises:
a fifth inverter connected between a fifth node connected to the first node and a sixth node connected to the third node;
a sixth inverter connected between the sixth node and the fifth node;
a fifth switch connected between the fifth inverter and the sixth node; and
a sixth switch connected between the sixth inverter and the fifth node.

11. The DCC of claim 10,
wherein the first duty cycle correction circuit comprises:
the first AC coupling capacitor connected between a terminal receiving the first input clock signal and the first node;
the first inverter connected between the first node and a second node;
a second inverter connected between the second node and a terminal outputting a first output clock signal;
the first feedback resistor connected between the first node and the second node;
a first switch connected between the first node and a terminal receiving a ground voltage; and a second switch connected between the second node and the first feedback resistor, and the second duty cycle correction circuit comprises:

the second AC coupling capacitor connected between a terminal receiving the second input clock signal forming a differential signal pair with the first input clock signal and the third node;

the third inverter connected between the third node and a fourth node;

a fourth inverter connected between the fourth node and a terminal outputting a second output clock signal;

the second feedback resistor connected between the third node and the fourth node;

a third switch connected between the third node and a terminal receiving a supply voltage; and a fourth switch connected between the fourth node and the second feedback resistor.

12. The DCC of claim 11, wherein a voltage level of the first node is a level of the ground voltage, and a voltage level of the third node is a level of the supply voltage when the first switch, the third switch and the fifth switch are turned on, and when the second switch and the fourth switch are turned off.

13. The DCC of claim 11, wherein a voltage level of the first node is a level of the ground voltage, and a voltage level of the third node is a level of the supply voltage when the fifth switch and the sixth switch are turned on, and when the first switch, the third switch, the second switch, and the fourth switch are turned off.

14. The DCC of claim 11, wherein a voltage level of the first node and a voltage level of the third node is between a level of the ground voltage and a level of the supply voltage when the fifth switch and the sixth switch are turned on, and when the first switch, the third switch, the second switch, and the fourth switch are turned off, while receiving the first input clock signal and the second input clock signal.

15. The DCC of claim 11, wherein the overshoot prevention circuit is disconnected when the second switch and the fourth switch are turned on, and when the first switch, the third switch, the fifth switch, and the sixth switch are turned off.

16. The DCC of claim 11, wherein duty cycles of the first input clock signal and the second input clock signal are compensated for based on the first feedback resistor and the second feedback resistor when the second switch and the fourth switch are turned on, and when the first switch, the third switch, the fifth switch, and the sixth switch are turned off.

17. A semiconductor device comprising:

a clock generator including a duty cycle corrector (DCC), wherein the DCC comprises:

a first duty cycle correction circuit configured to receive a first input clock signal and comprising a first alternating current (AC) coupling capacitor and a first inverter connected to a first feedback resistor;

a second duty cycle correction circuit configured to receive a second input clock signal and comprising a second AC coupling capacitor and a third inverter connected to a second feedback resistor; and an overshoot prevention circuit connected between a first node connecting the first AC coupling capacitor to the first inverter and a third node connecting the second AC coupling capacitor to the third inverter.

18. The semiconductor device of claim 17, wherein the overshoot prevention circuit comprises a cross-coupled latch.

19. The semiconductor device of claim 17, wherein the overshoot prevention circuit comprises:

a fifth inverter connected between a fifth node connected to the first node and a sixth node connected to the third node;

a sixth inverter connected between the sixth node and the fifth node;

a fifth switch connected between the fifth inverter and the sixth node; and a sixth switch connected between the sixth inverter and the fifth node.

20. The semiconductor device of claim 19, wherein the first duty cycle correction circuit comprises:

the first AC coupling capacitor connected between a terminal receiving the first input clock signal and the first node;

the first inverter connected between the first node and a second node;

a second inverter connected between the second node and a terminal outputting a first output clock signal;

the first feedback resistor connected between the first node and the second node;

a first switch connected between the first node and a terminal receiving a ground voltage; and a second switch connected between the second node and the first feedback resistor, and the second duty cycle correction circuit comprises:

the second AC coupling capacitor connected between a terminal receiving the second input clock signal forming a differential signal pair with the first input clock signal and the third node;

the third inverter connected between the third node and a fourth node;

a fourth inverter connected between the fourth node and a terminal outputting a second output clock signal;

the second feedback resistor connected between the third node and the fourth node;

a third switch connected between the third node and a terminal receiving a supply voltage; and a fourth switch connected between the fourth node and the second feedback resistor.

* * * * *